United States Patent
Jung et al.

(10) Patent No.: US 8,179,489 B2
(45) Date of Patent: May 15, 2012

(54) DISPLAY DEVICE

(75) Inventors: Kwang-Chul Jung, Seongnam-si (KR);
Hee-Seop Kim, Hwaseong-si (KR);
Chong-Chul Chai, Seoul (KR);
Sung-Woon Kim, Suwon-si (KR);
Mee-Hye Jung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 620 days.

(21) Appl. No.: 12/251,919

(22) Filed: Oct. 15, 2008

(65) Prior Publication Data
US 2009/0207330 A1 Aug. 20, 2009

(30) Foreign Application Priority Data

Feb. 15, 2008 (KR) .................. 10-2008-0014182

(51) Int. Cl.
*G02F 1/1343* (2006.01)
*G02F 1/136* (2006.01)
(52) U.S. Cl. ...................... 349/39; 349/139
(58) Field of Classification Search ............ 349/38–39, 349/48, 129
See application file for complete search history.

(56) References Cited

U.S. PATENT DOCUMENTS

| | | | |
|---|---|---|---|
| 6,825,907 B2* | 11/2004 | Hashiguchi et al. | 349/139 |
| 2004/0263745 A1* | 12/2004 | Lee et al. | 349/139 |
| 2005/0036091 A1* | 2/2005 | Song | 349/129 |
| 2007/0064164 A1* | 3/2007 | Tasaka et al. | 349/38 |
| 2007/0165146 A1* | 7/2007 | Park et al. | 349/38 |

* cited by examiner

*Primary Examiner* — Eric Wong
(74) *Attorney, Agent, or Firm* — F. Chau & Associates, LLC

(57) ABSTRACT

A display device includes a pixel electrode that includes a first sub-pixel electrode and a second sub-pixel electrode, a first thin film transistor connected to the first sub-pixel electrode, a second thin film transistor connected to the second sub-pixel electrode, an assistance capacitor connected to the first sub-pixel electrode, and a third thin film transistor connected to the assistance capacitor and the second sub-pixel electrode. The third thin film transistor includes a gate electrode, a source electrode overlapping the gate electrode and connected to the second sub-pixel electrode, and a drain electrode connected to the assistance capacitor, and a parasitic capacitance between the gate electrode and the drain electrode is equal to or less than a parasitic capacitance between the gate electrode and the source electrode.

21 Claims, 11 Drawing Sheets

DISPLAY DEVICE

CROSS-REFERENCE TO RELATED APPLICATION

This application claims priority to Korean Patent Application No. 10-2008-0014182 filed in the Korean Intellectual Property Office on Feb. 15, 2008, the disclosure of which is incorporated by reference herein in its entirety.

BACKGROUND OF THE INVENTION

1. Technical Field

The present invention relates to a display device.

2. Discussion of the Related Art

Liquid crystal displays (LCDs) are among the most widely used flat panel displays. For example, LCDs are commonly found in a variety of electronic devices such as televisions, laptop computers, personal digital assistants, cell phones and digital cameras.

An LCD includes a pair of panels provided with field-generating electrodes, such as pixel electrodes and a common electrode, and a liquid crystal (LC) layer interposed between the two panels. The LCD displays images by applying voltages to the field-generating electrodes to generate an electric field in the LC layer that determines the orientations of LC molecules therein to adjust polarization of incident light.

The LCD also includes switching elements connected to respective pixel electrodes, and a plurality of signal lines such as gate lines and data lines for controlling the switching elements and thereby applying voltages to the pixel electrodes.

LCDs generally include vertical alignment (VA) mode LCDs and patterned vertically aligned (PVA) mode LCDs. In VA mode LCDs, a longitudinal axis of an LC molecule is perpendicular to upper and lower panels in the absence of an electric field, and thus the contrast ratio is large and the reference viewing angle is wide. The reference viewing angle is defined as a viewing angle making a contrast ratio equal to 1:10 or as a limit angle for the inversion in luminance between grays, for example.

In the VA mode LCD, a wide viewing angle is achieved by forming a cutout in a field generating electrode, and forming a protrusion above or below the field generating electrode. Since the cutouts and the protrusions can determine the directions in which the LC molecules are inclined, the tilt directions can be distributed into various directions by appropriately arranging the cutouts and the protrusions to increase the reference viewing angle.

In the VA mode LCD, side visibility is inferior to front visibility. For example, in the case of a PVA mode LCD having cutouts, an image becomes brighter toward the side so that there is no difference in luminance among high gray levels, and in a severe case, the image looks crumbled.

In an LCD, to make the lateral visibility close to the front visibility, a method in which one pixel is divided into two sub-pixels and the two sub-pixels are applied with different voltages to obtain different transmittance has been proposed.

In one method, after dividing one pixel into two sub-pixels and capacitively coupling the two sub-pixels with each other, a voltage is directly applied to one sub-pixel and a drop in voltage is caused in the other sub-pixel by the capacitive coupling to make the voltages of the two sub-pixels different from each other, and thus make the transmittances of the two sub-pixels different from each other. However, since one of the voltages of the two sub-pixels is decreased in this method, the overall transmittance may be reduced.

In another method, the number of gate lines or data lines may be increased to apply the different voltages to the two sub-pixels. However, if the number of gate lines or data lines is increased, the aperture ratio of the LCD is reduced.

Accordingly, there exists a need for a technique of improving lateral visibility of an LCD without a reduction in transmittance or aperture ratio.

SUMMARY OF THE INVENTION

A display device according to an exemplary embodiment of the present invention includes a pixel electrode that includes a first sub-pixel electrode and a second sub-pixel electrode, a first thin film transistor connected to the first sub-pixel electrode, a second thin film transistor connected to the second sub-pixel electrode, an assistance capacitor connected to the first sub-pixel electrode, and a third thin film transistor connected to the assistance capacitor and the second sub-pixel electrode, wherein the third thin film transistor includes a gate electrode, a source electrode overlapping the gate electrode and connected to the second sub-pixel electrode, and a drain electrode connected to the assistance capacitor, and wherein a parasitic capacitance between the gate electrode and the drain electrode is equal to or less than a parasitic capacitance between the gate electrode and the source electrode.

An overlapping area between the gate electrode and the drain electrode may be equal to or less than the overlapping area between the gate electrode and the source electrode.

The drain electrode may be extended in a first direction with a bar shape.

The source electrode may enclose the drain electrode.

The source electrode may include a first portion overlapping the gate electrode and extended in the first direction, and a second portion overlapping the gate electrode, connected to the first portion, and extended in a second direction perpendicular to the first direction.

The source electrode may further include a third portion overlapping the gate electrode, connected to the second portion, and parallel to the first portion.

The first to third portions may substantially form a "U" shape opened toward the drain electrode.

A ratio of the overlapping area between the gate electrode and the drain electrode, and the overlapping area between the gate electrode and the source electrode, may be in a range of about 1:1 to about 1:5.

The display device may further include a first gate line connected to the first and second thin film transistors, a second gate line connected to the third thin film transistor and neighboring the first gate line, and a data line connected to the first and second thin film transistors.

The display device may further include a storage electrode line overlapping the pixel electrode, and a fourth thin film transistor connected to the first gate line, the storage electrode line, and the assistance capacitor.

A display device according to an exemplary embodiment of the present invention includes a first liquid crystal capacitor, a first storage capacitor coupled with the first liquid crystal capacitor in parallel, a second liquid crystal capacitor, a second storage capacitor coupled with the second liquid crystal capacitor in parallel, a first thin film transistor connected to the first liquid crystal capacitor, a second thin film transistor connected to the second liquid crystal capacitor, an assistance capacitor connected to the first liquid crystal capacitor, and a third thin film transistor connected between the assistance capacitor and the second liquid crystal capacitor, wherein a capacitance of the assistance capacitor is in the range of about 10% to about 50% of the sum of a capacitance of the first liquid crystal capacitor and a capacitance of the first storage capacitor.

The display device may further include a first gate line connected to the first and second thin film transistors, a second gate line connected to the third thin film transistor and neighboring the first gate line, and a data line connected to the first and second thin film transistors.

The display device may further include a storage electrode line, and a fourth thin film transistor connected to the first gate line, the storage electrode line, and the assistance capacitor.

The third thin film transistor may include a gate electrode connected to the second gate line, a source electrode connected to the second liquid crystal capacitor, and a drain electrode connected to the first liquid crystal capacitor through the assistance capacitor, and wherein a parasitic capacitance between the gate electrode and the drain electrode may be equal to or less than a parasitic capacitance between the gate electrode and the source electrode.

An overlapping area between the gate electrode and the drain electrode may be equal to or less than an overlapping area between the gate electrode and the source electrode.

The drain electrode may have a bar shape and the source electrode may include a substantially "U" shaped portion that encloses the drain electrode.

The drain electrode may include a facing portion and a connecting portion both having a bar shape.

The source electrode may include a substantially "U" shaped portion that encloses the facing portion.

The source electrode may include a first portion perpendicular to the second gate line and a second portion parallel to the second gate line, and wherein the source electrode encloses a portion of the facing portion.

The facing portion may be perpendicular to the second gate line and the source electrode may be parallel to the facing portion.

DETAILED DESCRIPTION OF EXEMPLARY EMBODIMENTS

Figure 1:
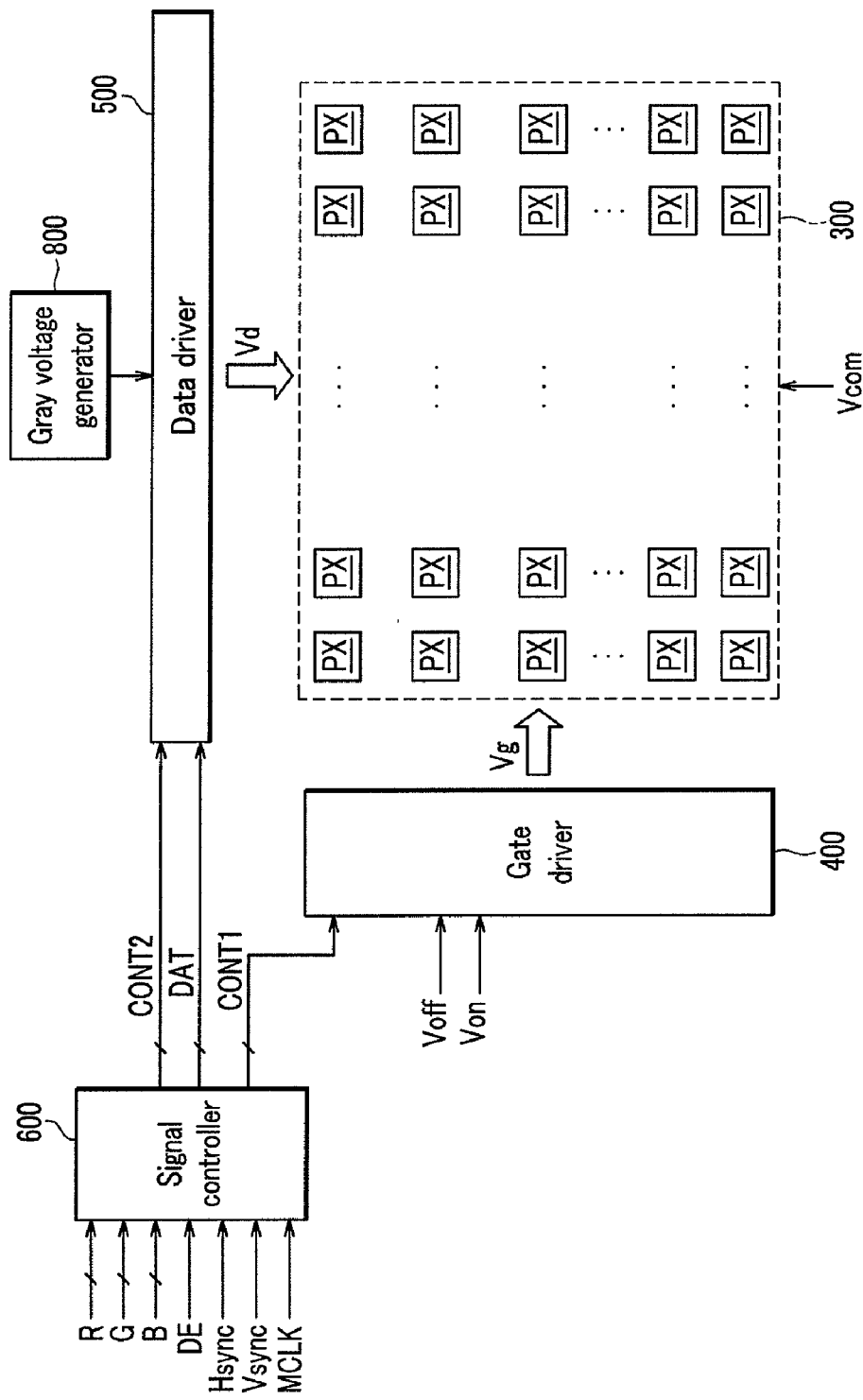
FIG. 1 is a block diagram of a liquid crystal display according to an exemplary embodiment of the present invention.

The present invention will be described more fully hereinafter with reference to the accompanying drawings, in which exemplary embodiments of the invention are shown. The present invention may, however, be embodied in many different forms and should not be construed as limited to the embodiments set forth herein.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

Now, a liquid crystal display according to an exemplary embodiment of the present invention will be described with reference to the drawings.

Figure 2:
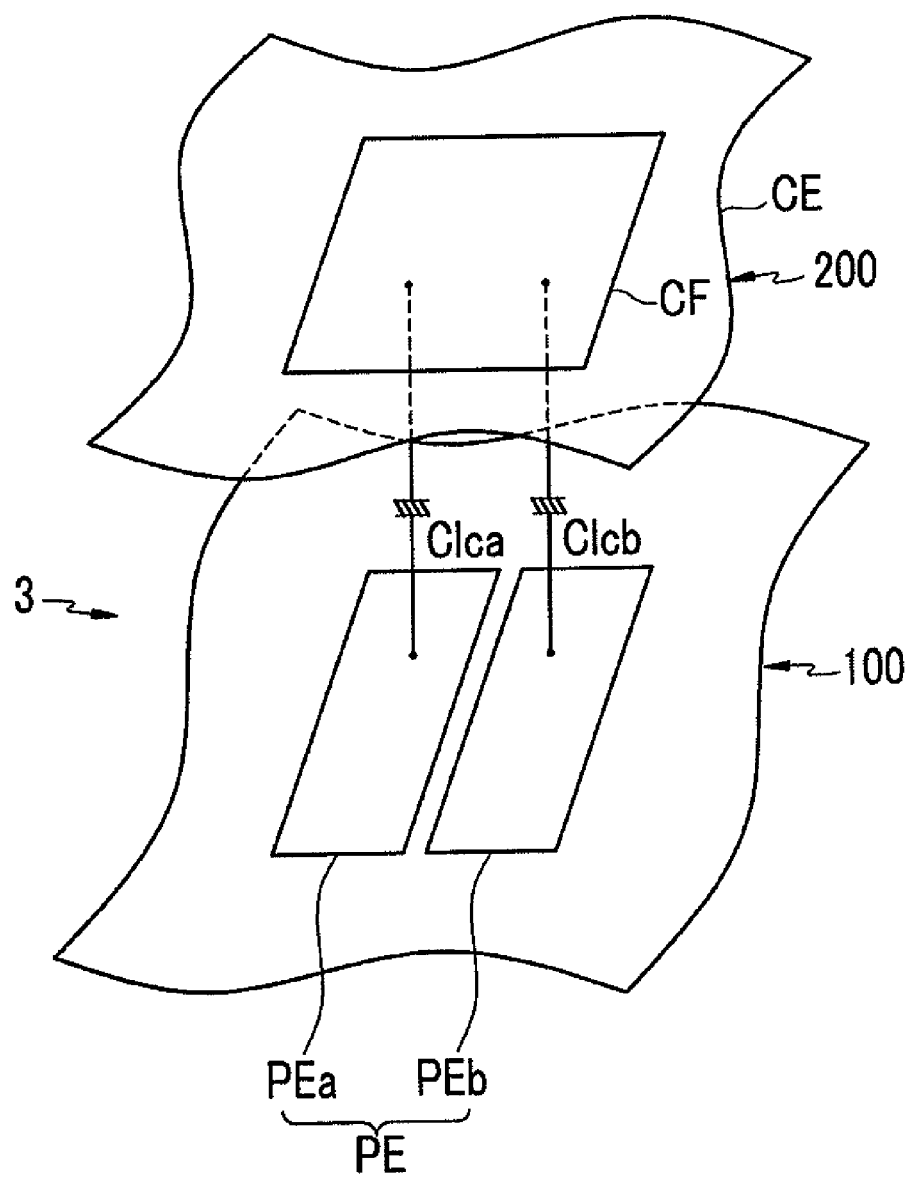
FIG. 2 is an equivalent circuit diagram of two sub-pixels shown along with a liquid crystal panel assembly according to an exemplary embodiment of the present invention.

FIG. 1 is a block diagram of a liquid crystal display according to an exemplary embodiment of the present invention, and FIG. 2 is an equivalent circuit diagram of two sub-pixels shown along with a liquid crystal panel assembly according to an exemplary embodiment of the present invention.

As shown in FIG. 1, a liquid crystal display according to an exemplary embodiment of the present invention includes a liquid crystal panel assembly 300, a gate driver 400, a data driver 500, a gray voltage generator 800, and a signal controller 600.

The liquid crystal panel assembly 300 includes a plurality of signal lines (not shown), and a plurality of pixels PX that are connected to the plurality of signal lines and are arranged in an approximate matrix shape. Referring to the structure shown in FIG. 2, the liquid crystal panel assembly 300 includes lower and upper display panels 100 and 200 that face each other, and a liquid crystal layer 3 that is interposed between the lower and upper display panels 100 and 200.

The signal lines are provided in the lower panel 100, and include a plurality of gate lines that transmit gate signals (also referred to as "scanning signals"), and a plurality of data lines that transmit data signals. The gate lines extend substantially in a row direction and are parallel with one another, and the data lines extend substantially in a column direction and are parallel with one another.

The liquid crystal panel assembly 300 according to the present exemplary embodiment includes a plurality of pixels PX connected to the signal lines.

Each of the pixels PX includes a pair of sub-pixels, and each sub-pixel includes liquid crystal capacitors Clca and Clcb. At least one of the two sub-pixels includes a switching element (not shown) that is connected to the gate line, the data line, and the liquid crystal capacitor Clca or Clcb.

The liquid crystal capacitors Clca and Clcb include sub-pixel electrodes PEa and PEb of the lower display panel 100 and a common electrode CE of the upper display panel 200 as two terminals, respectively, and the liquid crystal layer 3 between the sub-pixel electrodes PEa and PEb, and the common electrode CE, serves as a dielectric material. A pair of sub-pixel electrodes PEa and PEb that are separated from each other form one pixel electrode PE. The common electrode CE is formed on the entire surface of the upper display panel 200, and a common voltage Vcom is applied to the common electrode CE. The liquid crystal layer 3 has negative dielectric anisotropy, and liquid crystal molecules of the liquid crystal layer 3 may be aligned such that their major axes are perpendicular to the surfaces of the two display panels 100 and 200 when an electric field is not applied. Different from FIG. 2, the common electrode CE may be formed on the lower display panel 100, and at least one of the two electrodes PE and CE may have a linear shape or a bar shape.

To realize color display, each pixel PX uniquely displays one of the primary colors (spatial division) or each pixel PX temporally and alternately displays the primary colors (temporal division). Then, the primary colors are spatially and temporally synthesized, and thus a desired color is recognized. Examples of the primary colors may include the three primary colors of red, green, and blue. FIG. 2 shows an example of the spatial division. In FIG. 2, each pixel PX has a color filter CF that represents one of the primary colors in a region of the upper panel 200. Unlike FIG. 2, the color filter CF may be formed above or below the subpixel electrode PEa or PEb of the lower display panel 100.

At least one polarizer (not shown) for providing light polarization is provided on outer surfaces of the display panels 100 and 200.

Referring again to FIG. 1, the gray voltage generator 800 generates all gray voltages or a predetermined number of the gray voltages (or reference gray voltages) related to transmittance of the pixels PX. The (reference) gray voltages may include one set having a positive value for a common voltage Vcom, and another set having a negative value.

The gate driver 400 is connected to the gate lines G1 to Gn of the liquid crystal panel assembly 300, and applies gate signals obtained by combining a gate-on voltage Von and a gate-off voltage Voff to the gate lines G1 to Gn.

The data driver 500 is connected to the data lines D1 to Dm of the liquid crystal panel assembly 300, and selects the data signals from the gray voltage generator 800 to apply them to the data lines D1-Dm as data voltages. However, when the gray voltage generator 800 does not supply a voltage for all grays but supplies only a predetermined number of reference gray voltages, the data driver 500 divides the reference gray voltages to select image data signals.

The signal controller 600 controls the gate driver 400 and data driver 500.

Each of the drivers 400, 500, 600, and 800 may be directly mounted on the liquid crystal panel assembly 300 in the form of at least one IC chip, may be mounted on a flexible printed circuit film (not shown) and then mounted on the liquid crystal panel assembly 300 in the form of a tape carrier package (TCP), or may be mounted on a separate printed circuit board (not shown). Alternatively, the drivers 400, 500, 600, and 800 may be integrated with the liquid crystal panel assembly 300 together with, for example, the signal lines G1-Gn and D1-Dm and the thin film transistor switching elements Q. The drivers 400, 500, 600, and 800 may be integrated into a single chip. In this case, at least one of the drivers or at least one circuit forming the drivers may be arranged outside the single chip.

A liquid crystal panel assembly according to an exemplary embodiment of the present invention will now be described in detail with reference to FIG. 3 to FIG. 6.

Figure 3:
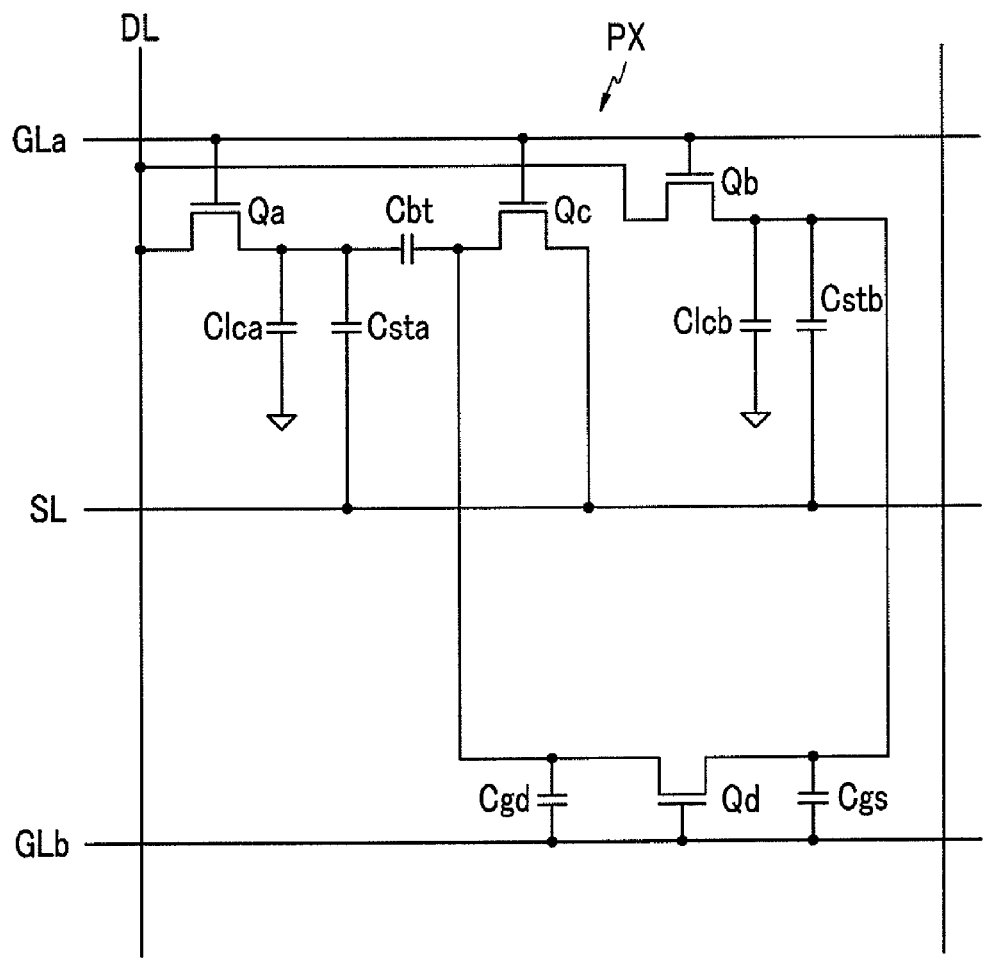
FIG. 3 is an equivalent circuit diagram of one pixel in a liquid crystal panel assembly according to an exemplary embodiment of the present invention.

FIG. 3 is an equivalent circuit diagram of one pixel in a liquid crystal panel assembly according to an exemplary embodiment of the present invention.

Referring to FIG. 3, the liquid crystal panel assembly according to the present exemplary embodiment includes signal lines having neighboring first and second gate lines GLa and GLb, a data line DL, a storage electrode line SL, and a plurality of pixels PX that are connected to the signal lines.

The pixel PX includes first, second, third, and fourth switching elements Qa, Qb, Qc, and Qd, first and second liquid crystal capacitors Clca and Clcb, first and second storage capacitors Csta and Cstb, and an assistance capacitor Cbt.

The first and second switching elements Qa and Qb are both connected to the first gate line GLa and the data line DL, the third switching element Qc is connected to the first gate line GLa and the storage electrode line SL, and the fourth switching element Qd is connected to the second gate line GLb, the second switching element Qb, and the third switching element Qc.

The first and second switching elements Qa and Qb are three terminal elements such as thin film transistors provided in the lower panel 100, the control terminals of which are connected to one of the first gate lines GLa, the input terminals of which are connected to the data line DL, and the output terminals of which are respectively connected to the liquid crystal capacitors Clca and Clcb and storage capacitors Csta and Cstb.

The third switching element Qc is a three terminal element such as a thin film transistor provided in the lower panel 100, the control terminal of which is connected to one of the first gate lines GLa, the input terminal of which is connected to the storage electrode line SL, and the output terminal of which is connected to the fourth switching element Qd and the assistance capacitor Cbt.

The fourth switching element Qd is a three terminal element such as a thin film transistor provided in the lower panel 100, the control terminal of which is connected to one of the second gate lines GLb, the input terminal of which is connected to the second liquid crystal capacitor Clcb, and the output terminal of which is connected to the output terminal of the third switching element Qc and the assistance capacitor Cbt.

A first parasitic capacitor Cgd is formed between the control terminal and the output terminal of the fourth switching element Qd, and a second parasitic capacitor Cgs is formed between the control terminal and the input terminal of the fourth switching element Qd. In the liquid crystal panel assembly according to an exemplary embodiment of the present invention, the capacitance of the first parasitic capacitor Cgd is equal to or less than that of the second parasitic capacitor Cgs.

The first and second storage capacitors Csta and Cstb that are respectively connected to the first and second switching elements Qa and Qb and the storage electrode line SL are auxiliary capacitors for the liquid crystal capacitors Clca and Clcb. The first and second storage capacitors Csta and Cstb respectively include the pixel electrode PE and the storage electrode line SL, which is provided on the lower panel 100, overlaps the pixel electrode PE via an insulator, and it is supplied with a predetermined voltage such as the common voltage Vcom.

The assistance capacitor Cbt is connected to the output terminal of the first switching element Qa, the output terminal of the third switching element Qc and the output terminal of the fourth switching element Qd.

According to an exemplary embodiment of the present invention, the capacitance of the assistance capacitor Cbt may be in the range of about 10% to about 50% of the sum of the capacitances of the first liquid crystal capacitor Clca and the first storage capacitor Csta.

Now, the liquid crystal panel assembly shown in FIG. 3 will be described in detail with reference to FIG. 4 to FIG. 6.

Figure 4:
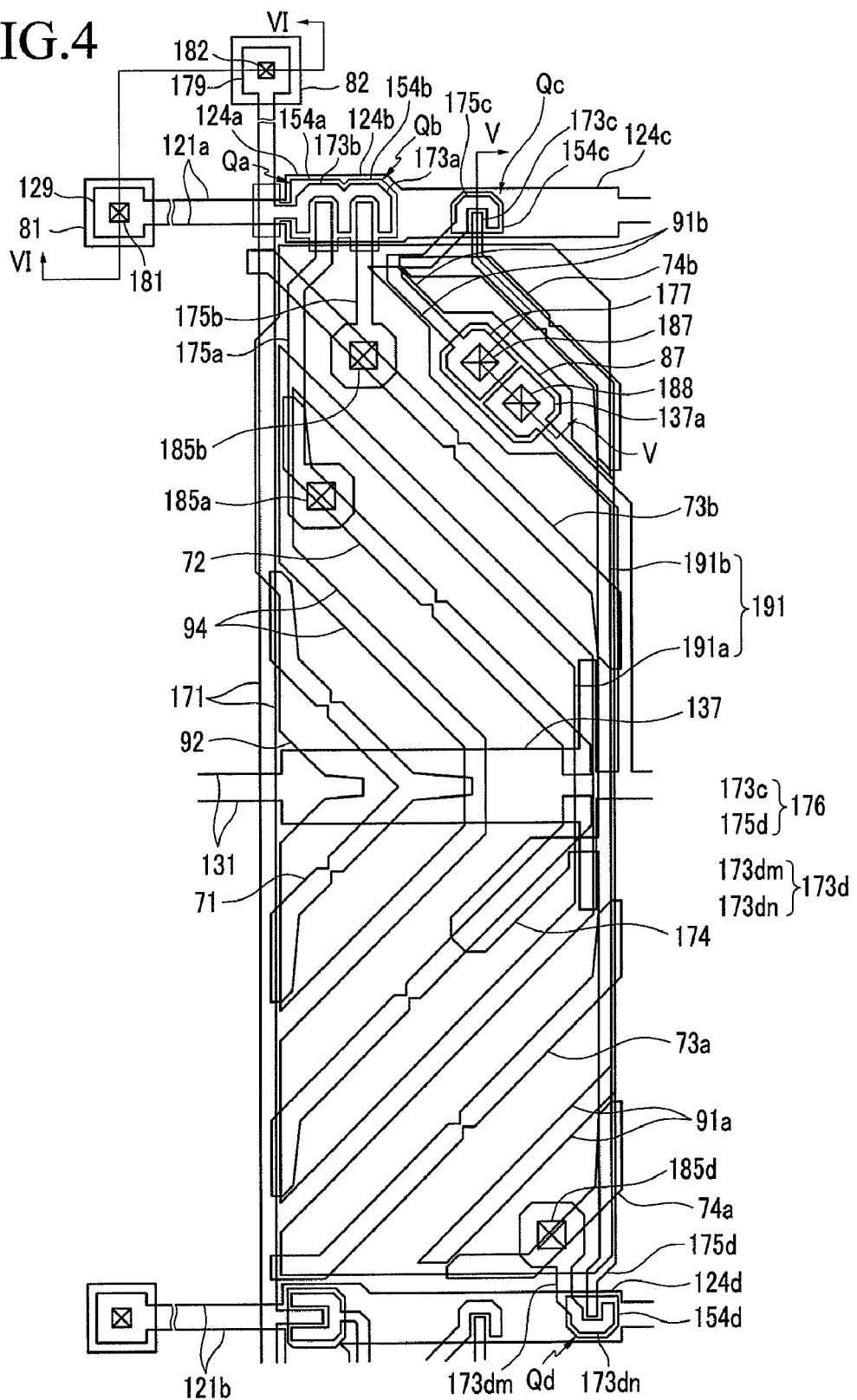
FIG. 4 is a layout view of a liquid crystal panel assembly according to an exemplary embodiment of the present invention.
Figure 5:
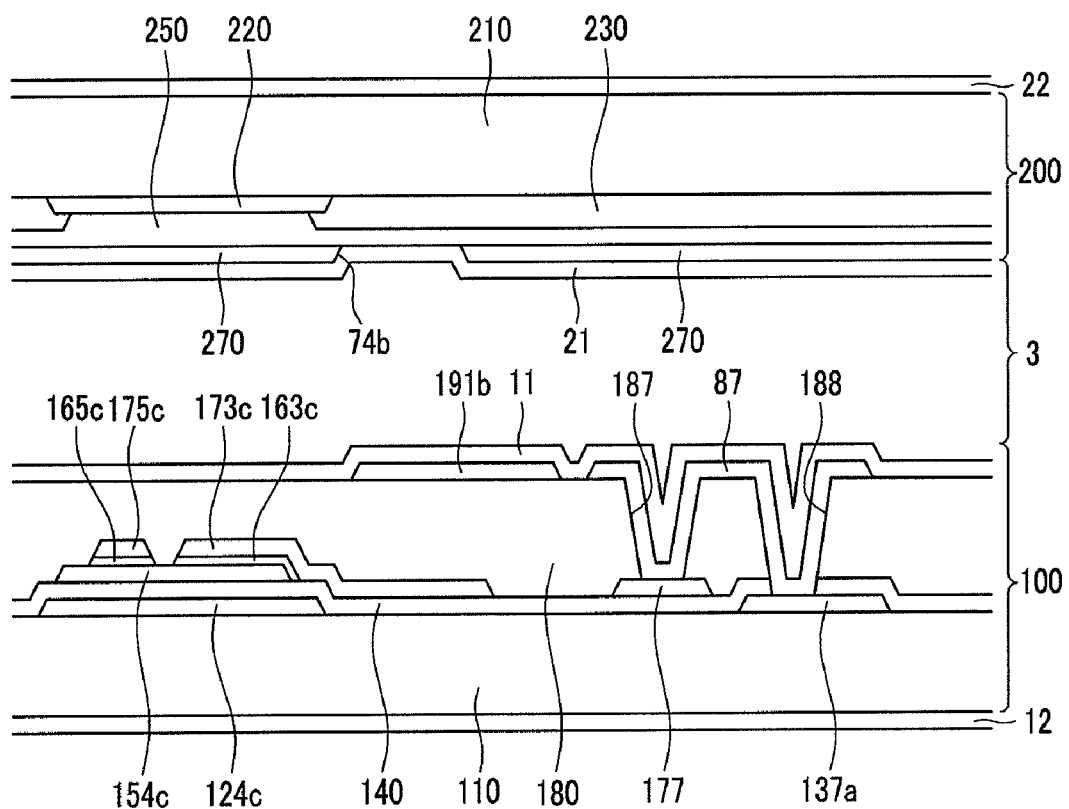
FIG. 5 and FIG. 6 are cross-sectional views of the liquid crystal panel assembly shown in FIG. 4 taken along lines V-V and VI-VI, respectively.
Figure 6:
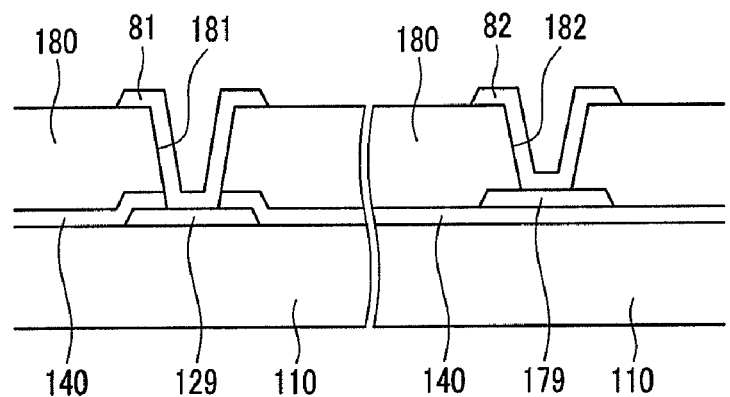

FIG. 4 is a layout view of a liquid crystal panel assembly according to an exemplary embodiment of the present invention, and FIG. 5 and FIG. 6 are cross-sectional views of the liquid crystal panel assembly shown in FIG. 4 taken along lines V-V and VI-VI, respectively.

A liquid crystal panel assembly according to an exemplary embodiment of the present invention includes a lower panel 100 and an upper panel 200 facing each other, a liquid crystal layer 3 formed between the two display panels 100 and 200, and a pair of polarizers 12 and 22 respectively attached on the outside of the display panels 100 and 200.

First, the lower panel 100 will be described.

A plurality of gate conductors including a plurality of first and second gate lines 121a and 121b and a plurality of storage electrode lines 131 are formed on an insulating substrate 110. Each of the gate lines 121a and 121b includes gate electrodes 124a and 124b, and 124c and 124d, and end portions 129, respectively, and each storage electrode line 131 includes a storage electrode 137. The storage electrode 137 has an end portion 137a with a wide area and is extended upward.

A gate insulating layer 140 is formed on the gate conductors 121a, 121b, and 131. First, second, third, and fourth semiconductor islands 154a, 154b, 154c, and 154d are formed on the gate insulating layer 140, and a plurality of first ohmic contacts (not shown), a second ohmic contact, (not shown), third ohmic contacts 163c and 165c, and a fourth ohmic contact (not shown) are formed thereon.

A data conductor including a plurality of data lines 171, a plurality of first, second, and third drain electrodes 175a, 175b, and 175c, and first and second electrode members 176 and 173d are formed on the ohmic contacts 163c and 165c and the gate insulating layer 140.

The data lines 171 include a plurality of first and second source electrodes 173a and 173b, and an end portion 179 having a wide area for connection with another layer or an external driving circuit. One end of the first electrode member 176 forms a third source electrode 173c facing the third drain electrode 175c, and the other end forms a fourth drain electrode 175d. The second electrode member 173d forms the fourth source electrode 173d facing the fourth drain electrode 175d.

The third drain electrode 175c is extended to form an expansion 177 facing the end portion 137a of the storage electrode 137.

The first, second, third, and fourth gate electrodes 124a, 124b, 124c, and 124d, the first, second, third, and fourth source electrodes 173a, 173b, 173c, and 173d, and the first, second, third, and fourth drain electrodes 175a, 175b, 175c, and 175d respectively form the first, second, third, and fourth thin film transistors (TFTs) Qa, Qb, Qc, and Qd along with the respective first, second, third, and fourth semiconductor islands 154a, 154b, 154c, and 154d, and channels of the TFTs Qa, Qb, Qc, and Qd are respectively formed in the semiconductors 154a, 154b, 154c, and 154d between the source electrodes 173a, 173b, 173c, and 173d and the drain electrodes 175a, 175b, 175c, and 175d.

The fourth source electrode 173d includes a facing portion 173dn enclosing a portion of the fourth drain electrode 175d, and a connection 173dm connected to the facing portion 173dn.

The facing portion 173dn overlaps the fourth gate electrode 124d, and faces and encloses three edges of the fourth drain electrode 175d of a stripe shape. In detail, the facing portion 173dn includes a first portion parallel to the gate line 121b, a second portion parallel to the data line 171, and a third portion. The first portion is disposed between the second portion and the third portion, and is perpendicular with respect to the second portion and the third portion. The first to third portions are connected to each other, and the facing portion 173dn substantially forms a "U" shape. However, the first to third portions may be directly connected to each other.

The overlapping area of the fourth drain electrode 175d and the fourth gate electrode 124d is less than the overlapping area of the fourth source electrode 173d and the fourth gate electrode 124d. The overlapping area between the fourth source electrode 173d and the fourth gate electrode 124d is about 1 to about 5 times more than the overlapping area between the fourth drain electrode 175d and the fourth gate electrode 124d.

Parasitic capacitances generated between the fourth gate electrode 124d and the fourth source electrode 173d, and between the fourth gate electrode 124d and the fourth drain electrode 175d, are determined by the overlapping areas. Accordingly, the parasitic capacitance generated between the fourth gate electrode 124d and the fourth drain electrode 175d is less than the parasitic capacitance generated between the fourth gate electrode 124d and the fourth source electrode 173d.

A passivation layer 180 is formed on the data conductors 171, 173d, 175a, 175b, 175c, and 176 and the exposed semiconductors 154a, 154b, 154c, and 154d.

The passivation layer 180 has a plurality of contact holes 182, 185a, 185b, 185d, and 187 respectively exposing the end portion 179 of the data line 171, the first drain electrode 175a, the second drain electrode 175b, the fourth drain electrode 175d, and the expansion 177 of the third drain electrode 175c, and the passivation layer 180 and the gate insulating layer 140 have a plurality of contact holes 181 and 188 respectively exposing the end portion 129 of the gate line 121 and the end portion 137a of the storage electrode 137.

A pixel electrode 191 including the first and the second sub-pixel electrodes, a plurality of contact assistants 81 and 82, and a connecting member 87 are formed on the passivation layer 180.

A pair of the first and second sub-pixel electrodes 191a and 191b engage with each other with a gap 94 disposed therebetween, and the first sub-pixel electrode 191a is interposed within the second sub-pixel electrode 191b. The gap 94 includes a vertical portion and an oblique portion.

The second sub-pixel electrode 191b includes lower and upper cutouts 91a and 91b, and a central cutout 92. The width of the central portion of the upper cutout 91b is extended, and the connecting member 87 is inserted therein. The central cutout 92 is extended according to the storage electrode line 131 and includes a pair of oblique portions.

The oblique portions of the gap 94 and the central cutout 92, and the lower and upper cutouts 91a and 91b, are inclined with respect to the gate lines 121a and 121b at an angle of about 45°.

The lower portion of the pixel electrode 191 is partitioned into four regions by the lower cutout 91a, the central cutout 92, and the gap 94, and the upper portion of the pixel electrode 191 is partitioned into four regions by the upper cutout 91b, the central cutout 92, and the gap 94. Here, the number of regions or cutouts may vary depending on design components, such as the size of the pixel electrode 191, the length ratio of the horizontal side and the vertical side of the pixel electrode 191, the type of liquid crystal layer 3, or other characteristics.

The pixel electrode 191 includes the first and second sub-pixel electrodes 191a and 191b that are separated from each other. The first and second sub-pixel electrodes 191a and 191b are physically and electrically connected to the first and second drain electrodes 175a and 175b through the contact holes 185a and 185b such that they receive data voltages from the first and second drain electrodes 175a and 175b, respectively. Also, the second sub-pixel electrode 191b is physically and electrically connected to the connection 173dm of the fourth source electrode 173d through the contact hole 185d.

The first and second sub-pixel electrodes 191a and 191b, to which the data voltages are applied, generate an electric field together with a common electrode 270 of the upper display panel 200 that receives the common voltage Vcom, to thereby determine a direction of liquid crystal molecules (not shown) of the liquid crystal layer 3 between the two electrodes 191 and 270. Polarization of light that transmits through the liquid crystal layer 3 differs depending on the determined direction of the liquid crystal molecules. The pixel electrode 191 and the common electrode 270 form a capacitor (referred to hereinafter as "liquid crystal capacitor") to sustain the applied voltage even after the TFT is turned off.

The first and second sub-pixel electrodes 191a and 191b overlap the storage electrode line 131 as well as the storage electrode 137. A capacitor formed as the pixel electrode 191 overlaps the storage electrode line 131 is called a storage capacitor, which strengthens the voltage storage capability of the liquid crystal capacitor.

The connecting member 87 is electrically connected to the expansion 177 of the third drain electrode 175c and one end portion 137a of the storage electrode 137 through the contact holes 187 and 188.

On the other hand, a portion of the first electrode member 176 is extended to form an auxiliary electrode 174 overlapping the first sub-pixel electrode 191a. The first sub-pixel electrode 191a and the auxiliary electrode 174 form an assistance capacitor Cbt via the passivation layer 180.

An alignment layer 11 is formed on the pixel electrode 191, the contact assistants 81 and 82, and the passivation layer 180.

Now, the upper display panel 200 will be described.

A light blocking member 220 is formed on an insulating substrate 210. The light blocking member 220 is called a black matrix and blocks light leakage.

A plurality of color filters 230 are formed on the substrate 210. The color filters 230 are mainly disposed in the regions enclosed by the light blocking member 220, and may extend according to the column of the pixel electrodes 191 in the vertical direction. Each color filter 230 may display one of the primary colors such as three the primary colors of red, green, and blue.

An overcoat 250 is formed on the color filters 230 and the light blocking member 220.

A common electrode 270 is formed on the overcoat 250. The common electrode 270 includes a set of a plurality of cutouts 71, 72, 73a, 73b, 74a, and 74b. Each of the cutouts 71-74b includes at least one oblique portion parallel to the lower cutout 91a or the upper cutout 91b of the pixel electrode 191. The oblique portions of the cutouts 71-74b include notches having a triangular shape.

Alignment layers 11 and 21 are formed inside the surfaces of the display panels 100 and 200.

The liquid crystal layer 3 has negative dielectric anisotropy. The liquid crystal molecules of the liquid crystal layer 3 are arranged such that a longitudinal axis of the liquid crystal molecules is perpendicular to the surfaces of the two panels 100 and 200 in the case that an electric field does not exist.

If the liquid crystal capacitors Clca and Clcb are charged, an electric field almost perpendicular to the surfaces of the display panels 100 and 200 is generated. The liquid crystal molecules change direction so that the long axes thereof are perpendicular to a direction of the electric field in response to the electric field.

On the other hand, the cutouts 91a-92 and 71-74b of the field generating electrodes 191 and 270, respectively, the gap 94, and the oblique edges of the pixel electrode 191 parallel thereto distort the electric field, and form a horizontal component that determines an inclined direction of the liquid crystal molecules. The horizontal component of the electric field is perpendicular to the oblique sides of the cutouts 91a-92 and 71-74b and the oblique side of the pixel electrode 191.

One set of the common electrode cutouts 71-74b, a set of pixel electrode cutouts 91a-92, and the gap 94 divide each pixel electrode 191 into sub-regions. Each sub-region has two major edges forming an oblique angle with respect to the major edges of the pixel electrode 191. The liquid crystal molecules disposed on each sub-region are perpendicularly inclined with respect to the major edges, and thus there are four inclined directions. Therefore, the viewing angle of the liquid crystal display is widened by varying the inclined directions of the liquid crystal molecules.

Next, an operation of a liquid crystal display according to an exemplary embodiment of the present invention will be described with reference to FIG. 4 to FIG. 6.

Referring to FIG. 4 to FIG. 6, if the gate-on voltage is applied to the first gate line 121a, the first to third thin film transistors Qa, Qb, and Qc connected thereto are turned on. Accordingly, the data voltages applied to the data line 171 are transmitted to the first and second sub-pixel electrodes 191a and 191b through the first and second thin film transistors Qa and Qb that are turned on. Here, the data voltages applied to the first and second sub-pixel electrodes 191a and 191b are the same. The first and second liquid crystal capacitors Clca and Clcb are charged with a voltage corresponding to a difference between the common voltage Vcom and the voltage of the first and second sub-pixel electrodes 191a and 191b, respectively. On the other hand, if the third thin film transistor Qc is turned on, the common voltage Vcom applied to the storage electrode line SL is transmitted to the auxiliary electrode 174, and the assistance capacitor Cbt is charged with the voltage corresponding to the difference between the voltage of the first sub-pixel electrode 191a and the common voltage Vcom.

Then, if the second gate line 121b is applied with the gate-on voltage, the fourth thin film transistor Qd is turned on. Thus, the voltage of the second sub-pixel electrode 191b is applied to the auxiliary electrode 174 through the turned-on fourth thin film transistor Qd. Therefore, the difference between the voltage of the first sub-pixel electrode 191a that forms the assistance capacitor Cbt along with the auxiliary electrode 174, and the common voltage Vcom, is increased. Accordingly, the difference between the common voltage Vcom and the voltage of the second sub-pixel electrode 191b after turning on the fourth thin film transistor Qd is less than the difference between the common voltage Vcom and the voltage of the second sub-pixel electrode 191b before turning on the fourth thin film transistor Qd, and the difference between the common voltage Vcom and the voltage of the first sub-pixel electrode 191a after turning on the fourth thin film transistor Qd is more than the difference between the common voltage Vcom and the voltage of the first sub-pixel electrode 191a before turning on the fourth thin film transistor Qd. In other words, the charging voltage of the second liquid crystal capacitor Clcb becomes less than the charging voltage of the first liquid crystal capacitor Clca after turning on the fourth thin film transistor Qd.

The charging voltages of the two liquid crystal capacitors Clca and Clcb represent different gamma curves, and the gamma curve for the voltage of one pixel becomes a curved line when the gamma curves are combined. In a liquid crystal panel assembly, a combined gamma curve that is best suited for the front is selected to accord with a reference gamma curve at the front, and a combined gamma curve at the lateral side is made closer to the reference gamma curve at the front. Accordingly, the image data is converted to thereby improve the side visibility.

Here, the voltages of the first and second sub-pixel electrodes 191a and 191b are reduced by the voltage change that occurs when a gate-on voltage becomes a gate-off voltage, and this is called a kick-back voltage (ΔVk). Each of the kick-back voltages ΔVkba and ΔVkbb of the first and second sub-pixel electrodes 191a and 191b may be represented by the following equations.

$$\Delta Vkba = \frac{Cgd}{Clca + Csta + Cgd} \times \Delta Vg$$

$$\Delta Vkbb = \frac{Cgs}{Clcb + Cstb + Cgs} \times \Delta Vg$$

Here, Cgd is a parasitic capacitance between the fourth gate electrode 124d and the fourth drain electrode 175d, Cgs is a parasitic capacitance between the fourth gate electrode 124d and the fourth source electrode 175s, and ΔVg is a difference between the gate-on voltage and the gate-off voltage.

The sum ΔVkba+ΔVkbb of the kick-back voltages according to the gate signal applied to the second gate line 121b is uniform such that if one of the two is increased, the other is decreased.

Here, if the kick-back voltage ΔVkba of the first sub-pixel electrode 191a is small and the kick-back voltage ΔVkbb of the second sub-pixel electrode 191b is large, the difference between the voltages of the two sub-pixel electrodes 191a and 191b may be increased compared with the case in which the kick-back voltage ΔVkba of the first sub-pixel electrode 191a is large and the kick-back voltage ΔVkbb of the second sub-pixel electrode 191b is small. Accordingly, the case in which the kick-back voltage ΔVkba of the first sub-pixel electrode 191a is small and the kick-back voltage ΔVkbb of the second sub-pixel electrode 191b is large may cause the lateral visibility obtained by combining the pair of different voltages of the two sub-pixels 191a and 191b to be improved more so than the case in which the kick-back voltage ΔVkba of the first sub-pixel electrode 191a is large and the kick-back voltage ΔVkbb of the second sub-pixel electrode 191b is small.

Also, the area of the first sub-pixel electrode 191a is generally smaller than the area of the second sub-pixel electrode 191b such that the capacitance of the first liquid crystal capacitor Clca is less than the capacitance of the second liquid crystal capacitor Clcb. Accordingly, the first liquid crystal capacitor Clca is more easily influenced by the kick-back voltage than the second liquid crystal capacitor Clcb. Therefore, the kick-back voltage ΔVkba of the first sub-pixel electrode 191a is less than the kick-back voltage ΔVkbb of the second sub-pixel electrode 191b. In other words, the parasitic capacitance between the fourth drain electrode 175d and the fourth gate electrode 124d must be less than the parasitic capacitance between the fourth source electrode 173d and the fourth gate electrode 124d to effectively improve the lateral visibility.

On the other hand, the differences between the charging voltages of the first and second liquid crystal capacitors Clca and Clcb is increased according to the increasing of the capacitance of the assistance capacitor Cbt. However, if the capacitance of the assistance capacitor Cbt is extremely large, the charging voltage of the second liquid crystal capacitor Clcb is significantly decreased such that the entire transmittance of the liquid crystal display is decreased. Accordingly, to prevent the decrease of the entire transmittance while appropriately maintaining the charging voltage of the first and second liquid crystal capacitors Clca and Clcb, the capacitance of the assistance capacitor Cbt is in the range of about 10% to about 50% of the sum of the capacitances of the first liquid crystal capacitor Clca and the first storage capacitor Csta.

Now, exemplary embodiments of the fourth thin film transistor shown in FIG. 4 will be described in detail.

Figure 7:
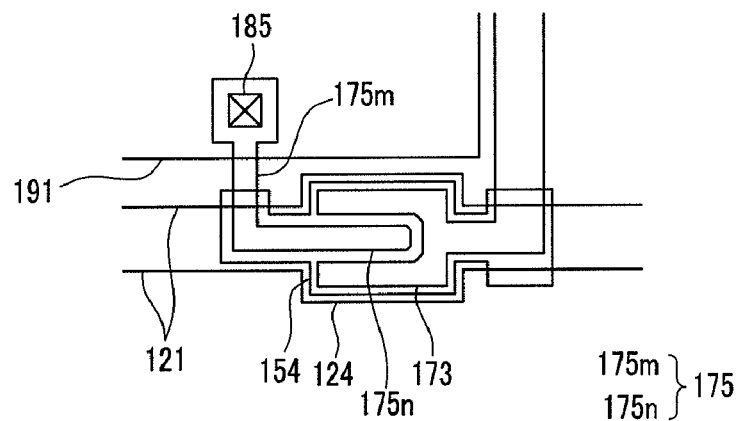
FIG. 7 to FIG. 9 are layout views of a fourth thin film transistor of the liquid crystal panel assembly shown in FIG. 4 according to exemplary embodiments of the present invention.
Figure 8:
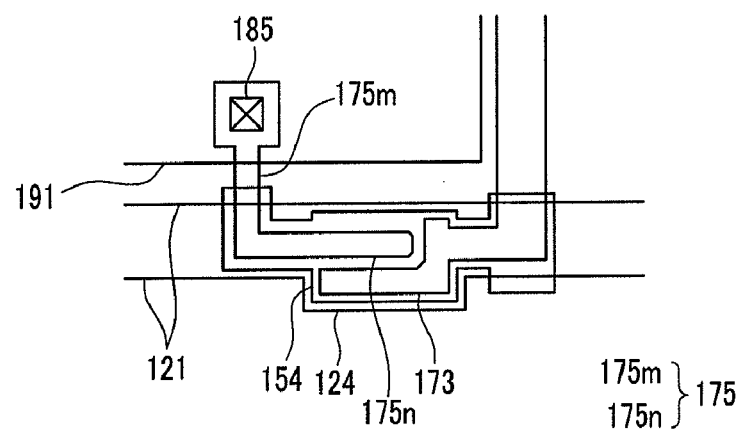
Figure 9:
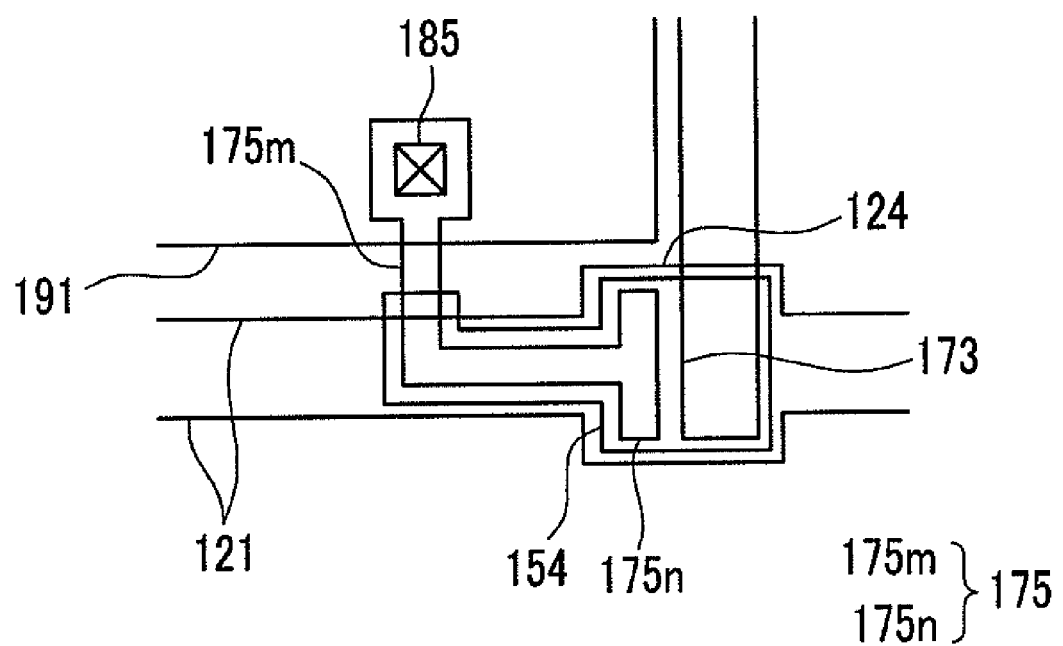

FIG. 7 to FIG. 9 are layout views of the fourth thin film transistor of the liquid crystal panel assembly shown in FIG. 4 according to exemplary embodiments of the present invention.

First, referring to FIG. 7, the fourth thin film transistor of the liquid crystal panel assembly according to an exemplary embodiment of the present invention includes a gate electrode 124, a source electrode 173, a drain electrode 175, and a semiconductor member 154.

The gate electrode 124 as a portion of the gate line 121 may be formed by extending the gate line 121 upward and downward, and is insulated from the semiconductor member 154, the source electrode 173, and the drain electrode 175.

The semiconductor member 154 overlaps the gate electrode 124.

The drain electrode 175 extending toward the gate electrode 124 overlaps the gate electrode 124 and has a bar shape. The drain electrode 175 includes a facing portion 175n and a connection portion 175m connected thereto and having a bar shape.

The source electrode 173 encloses the facing portion 175n of the drain electrode 175 and has a substantially "U" shaped portion opened toward the facing portion 175n.

The overlapping area of the facing portion 175n of the drain electrode 175 and the gate electrode 124 is less than the overlapping area between the source electrode 173 and the gate electrode 124.

However, in the thin film transistor of FIG. 7, the lengthwise direction of the facing portion 175n of the drain electrode 175 is parallel to the gate line 121, and the source electrode 173 is opened at the left side thereof, different from the fourth thin film transistor of FIG. 4.

Referring to FIG. 8, the fourth thin film transistor of the liquid crystal panel assembly according to an exemplary embodiment of the present invention includes a gate electrode 124, a source electrode 173, a drain electrode 175 having a facing portion 175n and a connection portion 175m, and a semiconductor member 154.

In the case of FIG. 8, the overlapping area between the facing portion 175n of the drain electrode 175 and the gate electrode 124 is less than the overlapping area between the source electrode 173 and the gate electrode 124.

However, in the thin film transistor of FIG. 8, the source electrode 173 only encloses a portion of the facing portion 175n of the drain electrode 175 with the bar shape, different from the fourth thin film transistor of FIG. 4 and the fourth thin film transistor of FIG. 7. In other words, the source electrode 173 includes a first portion perpendicular to the gate line 121 and a second portion parallel to the gate line 121. In this case, compared with the fourth thin film transistor of FIG. 4 or FIG. 7, the width of the channel becomes small, and the overlapping area between the gate electrode 124 and the source electrode 173 is decreased such that the parasitic capacitance between the gate electrode 124 and the source electrode 173 may be reduced.

Now, referring to FIG. 9, the fourth thin film transistor of the liquid crystal panel assembly according to an exemplary embodiment of the present invention includes a gate electrode 124, a source electrode 173, a drain electrode 175 including a facing portion 175n and a connection portion 175m, and a semiconductor member 154.

In the case of FIG. 9, the facing portion 175n of the drain electrode 175 has a bar shape perpendicular to the gate line 121, and the source electrode 173 is parallel to the facing portion 175n of the drain electrode 175. The overlapping area between the facing portion 175n of the drain electrode 175 and the gate electrode 124 is substantially the same as the overlapping area between the source electrode 173 and the gate electrode 124. In this case, compared with the fourth thin film transistor of FIG. 4 or FIG. 7, the width of the channel becomes small, but the overlapping area between the gate electrode 124 and the source electrode 173 and the overlapping area between the gate electrode 124 and the drain electrode 175 may be decreased, and both the parasitic capacitance between the gate electrode 124 and the source electrode 173 and the parasitic capacitance between the gate electrode 124 and the drain electrode 175 may be reduced.

Now, operational characteristics of a liquid crystal display according to exemplary embodiments of the present invention will be described with reference to FIG. 10 to FIG. 13 and the above-described FIG. 1.

Figure 10:
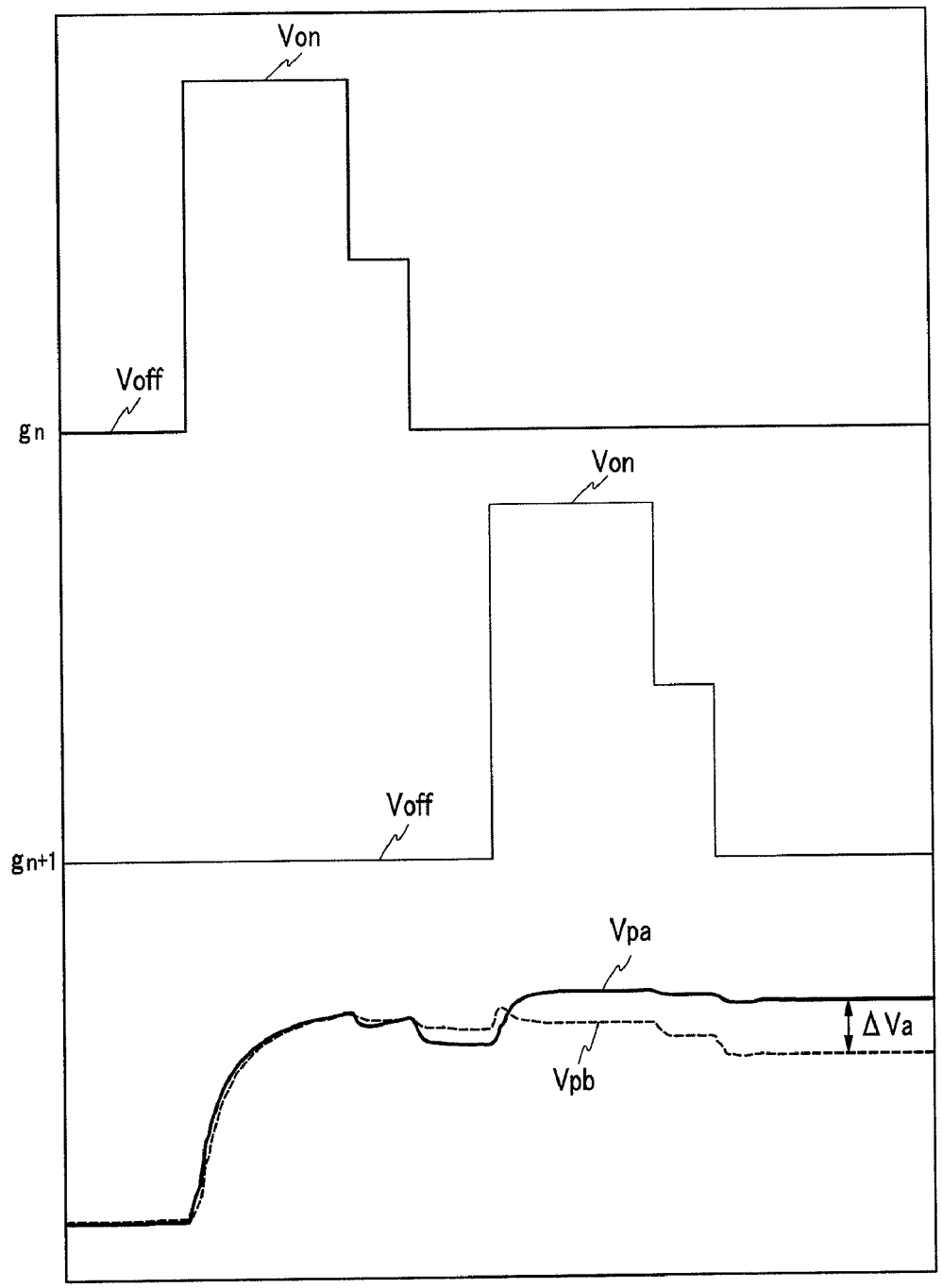
FIG. 10 is a waveform diagram showing a driving voltage of a liquid crystal display including the thin film transistors shown in FIG. 4, FIG. 7, and FIG. 8.

FIG. 10 is a waveform diagram showing a driving voltage of a liquid crystal display including the thin film transistors shown in FIG. 4, FIG. 7, and FIG. 8, and FIG. 11 is a waveform diagram showing a driving voltage of a liquid crystal display including the thin film transistor shown in FIG. 9.

First, referring to FIG. 1, the signal controller 600 receives input image signals R, G, and B and input control signals for controlling display of the input image signals R, G, and B from an external graphics controller (not shown). The input image signals R, G, and B include luminance information of each pixel PX, and the luminance information includes a predetermined number of gray levels, e.g., 1024 (=$2^{10}$), 256 (=$2^8$), or 64 (=$2^6$) gray levels. The input control signals include, for example, a vertical synchronization signal Vsync, a horizontal synchronization signal Hsync, a main clock signal MCLK, a data enable signal DE, etc.

The signal controller 600 appropriately processes the input image signals R, G, and B according to operating conditions of the liquid crystal panel assembly 300 based on the input image signals R, G, and B and the input control signals, generates a gate control signal CONT1, a data control signal CONT2, a storage electrode control signal CONT3 (not shown), etc., and transmits the gate control signal CONT1 to the gate driver 400, transmits the data control signal CONT2 and the processed image signal DAT to the data driver 500, and transmits the storage electrode control signal CONT3 to a storage electrode driver 700 (not shown). The output image signal DAT includes values (or grays) of the determined number as digital signals.

The data driver 500 receives the digital image signal DAT with respect to one row of pixels PX according to the data control signal CONT2 received from the signal controller 600, selects a gray voltage corresponding to each digital image signal DAT to thus convert the digital image signal DAT into an analog data signal, and applies it to the corresponding image data lines DL.

The gate driver 400 sequentially applies the gate-on voltage Von to the gate lines GLa and GLb according to the gate control signal CONT1 from the signal controller 600.

Figure 11:
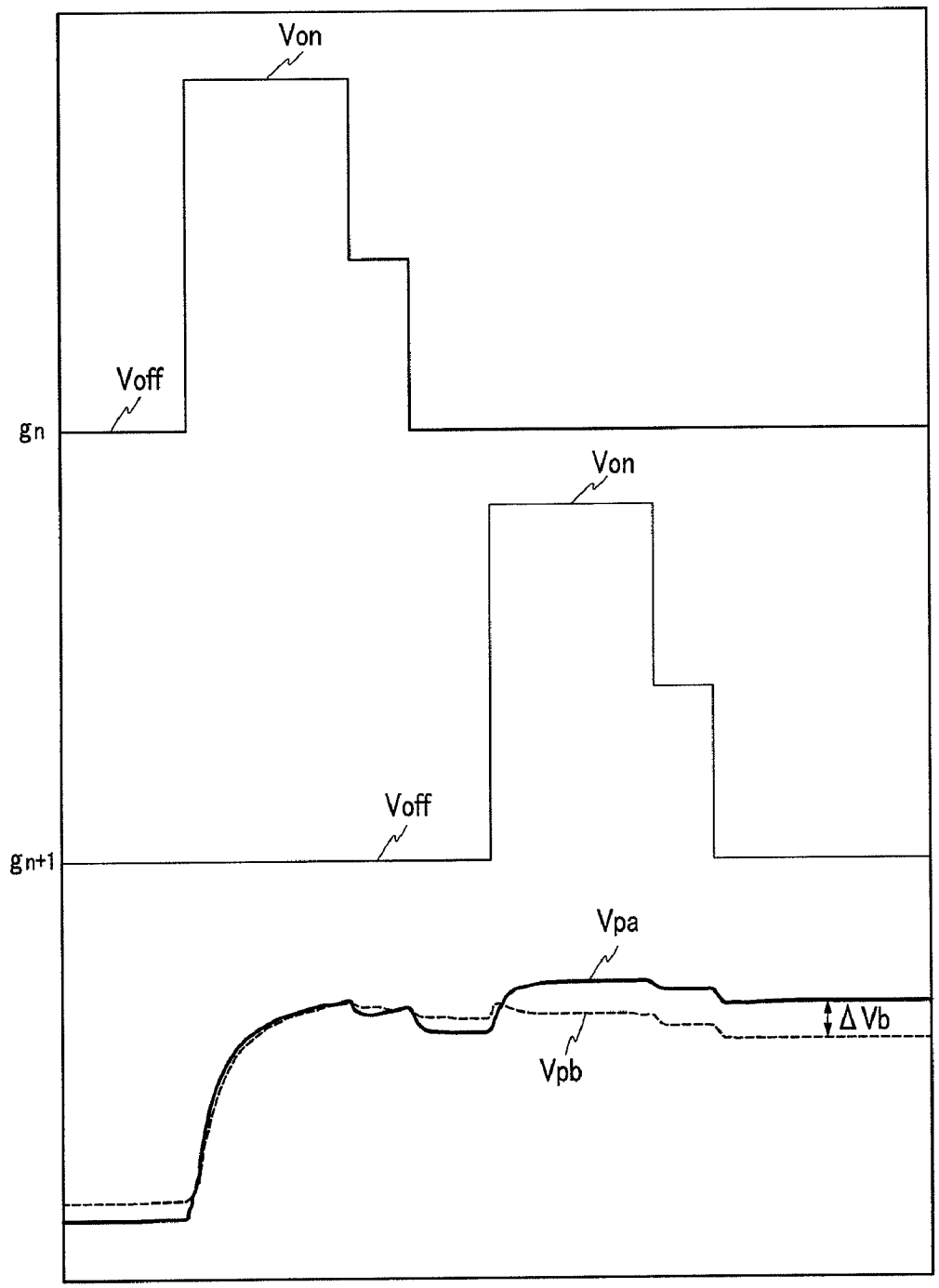
FIG. 11 is a waveform diagram showing a driving voltage of a liquid crystal display including the thin film transistor shown in FIG. 9.

Referring to FIG. 10 and FIG. 11, if the gate signal $g_n$ applied to the first gate line GLa is the gate-on voltage Von, the first to third thin film transistors Qa, Qb, and Qc connected to the first gate line GLa are turned on. Thus, the data voltage Vd applied to the data line DL is applied to the first and second sub-pixel electrodes 191a and 191b through the turned-on first and second thin film transistors Qa and Qb. Accordingly, the voltages Vpa and Vpb of the first and second sub-pixel electrodes 191a and 191b are increased by almost the same degree.

Next, if the gate signal $g_{n+1}$ applied to the second gate line GLb is the gate-on voltage Von, the fourth thin film transistor Qd connected thereto is turned on. Thus, the charging voltage to the second sub-pixel electrode 191b moves to the auxiliary electrode 174 through the fourth thin film transistor Qd. Accordingly, the assistance capacitor Cbt including the auxiliary electrode 174 as one terminal is floated such that the voltage Vpa of the first sub-pixel electrode 191a is increased and the voltage Vpb of the second sub-pixel electrode 191b is decreased. Next, if the gate signal $g_{n+1}$ applied to the second gate line GLb is the gate-off voltage Voff, the voltage Vpa of the first sub-pixel electrode 191a and the voltage Vpb of the second sub-pixel electrode 191b are decreased by some degree by the kick-back voltage. As a result, the difference between the voltage Vpa of the first sub-pixel electrode 191a and the voltage Vpb of the second sub-pixel electrode 191b is ΔVa in the case of FIG. 10 and ΔVb in the case of FIG. 11.

Here, the voltage Vpa of the first sub-pixel electrode 191a is less influenced by the kick-back voltage when the gate-off voltage Voff is applied to the second gate line GLb in the case of FIG. 10 than in the case of FIG. 11. Accordingly, the difference between the voltage Vpa of the first sub-pixel electrode 191a and the voltage Vpb of the second sub-pixel electrode 191b is larger in the case of FIG. 10 than in the case of FIG. 11, i.e., ΔVa is more than ΔVb.

Next, a conventional liquid crystal display will be described with reference to FIG. 12 and FIG. 13 to serve as a comparison with the liquid crystal display according to the exemplary embodiments of the present invention.

Figure 12:
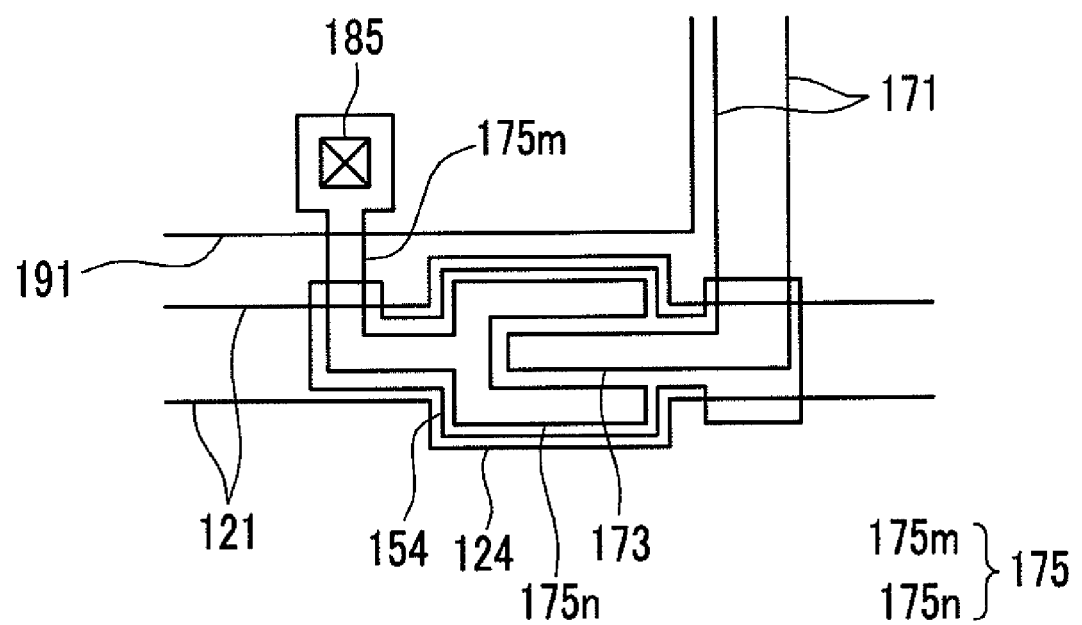
FIG. 12 is a layout view of a conventional fourth thin film transistor of a liquid crystal panel assembly.
Figure 13:
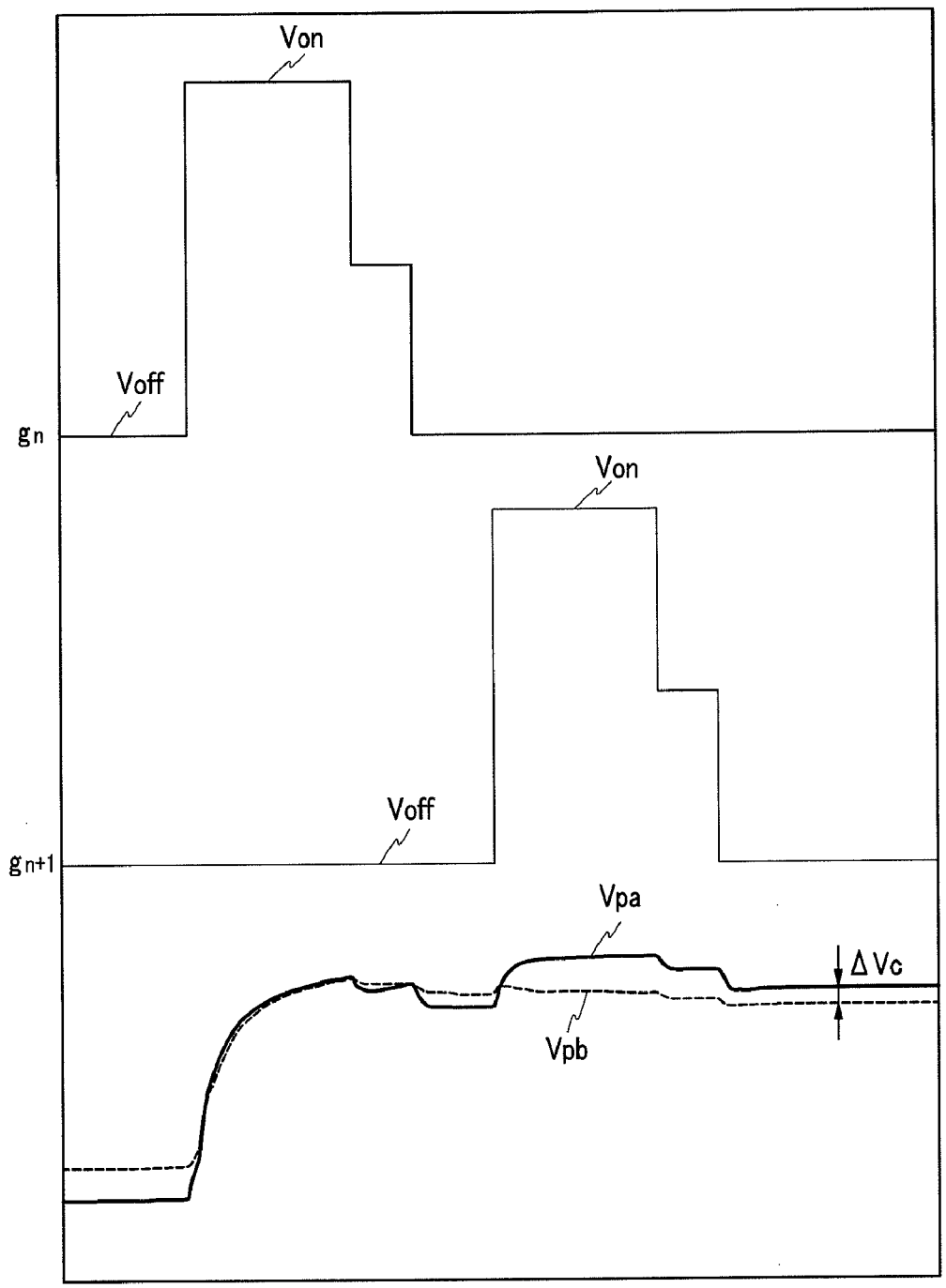
FIG. 13 is a waveform diagram showing a driving voltage of a liquid crystal display including the thin film transistor shown in FIG. 12.

FIG. 12 is a layout view of a conventional fourth thin film transistor of a liquid crystal panel assembly, and FIG. 13 is a waveform diagram showing a driving voltage of a liquid crystal display including the fourth thin film transistor shown in FIG. 12.

Referring to FIG. 12, the conventional fourth thin film transistor of a liquid crystal panel assembly includes a gate electrode 124, a source electrode 173, a drain electrode 175 including a facing portion 175n and a connection portion 175m, and a semiconductor member 154.

However, in conventional the fourth thin film transistor of the liquid crystal panel assembly, the facing portion 175n of the drain electrode 175 encloses the source electrode 173 with the bar shape. In other words, the overlapping area of the facing portion 175n of the drain electrode 175 and the gate electrode 124 is larger than the overlapping area between the source electrode 173 and the gate electrode 124.

Referring to FIG. 13, in a conventional liquid crystal display including the fourth thin film transistor shown in FIG. 12, the gate signal $g_n$ applied to the first gate line GLa becomes the gate-on voltage Von, and the voltages Vpa and Vpb of the first and second sub-pixel electrodes 191a and 191b are increased. If the first gate line GLa is applied with the gate-off voltage Voff, the gate signal $g_{n+1}$ applied to the second gate line GLb becomes the gate-on voltage Von, the voltage Vpa of the first sub-pixel electrode 191a is increased, and the voltage Vpb of the second sub-pixel electrode 191b is decreased. Next, if the gate signal $g_{n+1}$ applied to the second gate line GLb is changed to the gate-off voltage Voff, the voltages Vpa and Vpb of the first and second sub-pixel electrodes 191a and 191b are decreased. However, the parasitic capacitance between the drain electrode 175 and the gate electrode 124 is relatively large such that the voltage Vpa of the first sub-pixel electrode 191a is relatively more influenced by the kick-back voltage, and as a result the decrease degree is larger than in the cases of FIG. 10 and FIG. 11. Accordingly, the difference between the voltages Vpa and Vpb of the first and second sub-pixel electrodes 191a and 191b becomes ΔVc, which is less than ΔVa and ΔVb. Therefore, the difference between the voltages Vpa and Vpb of the first and second sub-pixel electrodes 191a and 191b is small such that the lateral visibility is not improved.

As described above, according to the exemplary embodiments of the present invention, the overlapping area between the gate electrode 124 and the drain electrode 175 of the fourth thin film transistor is equal to or less than the overlapping area between the gate electrode 124 and the source electrode 173 such that the change of the voltages Vpa and Vpb of the two sub-pixels 191a and 191b according to the parasitic capacitance of the display device is appropriately controlled, thereby improving the lateral visibility of the display device without a reduction of the transmittance or the aperture ratio.

While the present invention has been described in detail with reference to the exemplary embodiments, those skilled in the art will appreciate that various modifications and substitutions can be made thereto without departing from the spirit and scope of the present invention as set forth in the appended claims.

What is claimed is:

1. A display device comprising:
    a pixel electrode that includes a first sub-pixel electrode and a second sub-pixel electrode;
    a first thin film transistor connected to the first sub-pixel electrode;
    a second thin film transistor connected to the second sub-pixel electrode;
    an assistance capacitor connected to the first sub-pixel electrode; and
    a third thin film transistor connected to the assistance capacitor and the second sub-pixel electrode,
    wherein the third thin film transistor comprises a gate electrode, a source electrode overlapping the gate electrode and connected to the second sub-pixel electrode, and a drain electrode connected to the assistance capacitor, and
    wherein a parasitic capacitance between the gate electrode and the drain electrode is less than a parasitic capacitance between the gate electrode and the source electrode.

2. The display device of claim 1, wherein an overlapping area between the gate electrode and the drain electrode is equal to or less than the overlapping area between the gate electrode and the source electrode.

3. The display device of claim 2, wherein the drain electrode is extended in a first direction with a bar shape.

4. The display device of claim 3, wherein the source electrode encloses the drain electrode.

5. The display device of claim 4, wherein the source electrode comprises a first portion overlapping the gate electrode and extended in the first direction, and a second portion overlapping the gate electrode, connected the first portion, and extended in a second direction perpendicular to the first direction.

6. The display device of claim 5, wherein the source electrode further comprises a third portion overlapping the gate electrode, connected to the second portion, and parallel to the first portion.

7. The display device of claim 6, wherein the first to third portions substantially form a "U" shape opened toward the drain electrode.

8. The display device of claim 2, wherein a ratio of the overlapping area between the gate electrode and the drain electrode, and the overlapping area between the gate electrode and the source electrode, is in a range of about 1:1 to about 1:5.

9. The display device of claim 1, further comprising:
    a first gate line connected to the first and second thin film transistors;
    a second gate line connected to the third thin film transistor, and neighboring the first gate line; and
    a data line connected to the first and second thin film transistors.

10. The display device of claim 9, further comprising:
    a storage electrode line overlapping the pixel electrode; and
    a fourth thin film transistor connected to the first gate line, the storage electrode line, and the assistance capacitor.

11. A display device comprising:
    a first liquid crystal capacitor;
    a first storage capacitor coupled with the first liquid crystal capacitor in parallel;
    a second liquid crystal capacitor;
    a second storage capacitor coupled with the second liquid crystal capacitor in parallel;
    a first thin film transistor connected to the first liquid crystal capacitor;
    a second thin film transistor connected to the second liquid crystal capacitor;
    an assistance capacitor connected to the first liquid crystal capacitor; and
    a third thin film transistor connected between the assistance capacitor and the second liquid crystal capacitor,
    wherein a capacitance of the assistance capacitor is in a range of about 10% to about 50% of the sum of a capacitance of the first liquid crystal capacitor and a capacitance of the first storage capacitor.

12. The display device of claim 11, further comprising:
    a first gate line connected to the first and second thin film transistors;
    a second gate line connected to the third thin film transistor and neighboring the first gate line; and
    a data line connected to the first and second thin film transistors.

13. The display device of claim 12, further comprising:
    a storage electrode line; and
    a fourth thin film transistor connected to the first gate line, the storage electrode line, and the assistance capacitor.

14. The display device of claim 12, wherein the third thin film transistor comprises a gate electrode connected to the second gate line, a source electrode connected to the second liquid crystal capacitor, and a drain electrode connected to the first liquid crystal capacitor through the assistance capacitor; and
    wherein a parasitic capacitance between the gate electrode and the drain electrode is equal to or less than a parasitic capacitance between the gate electrode and the source electrode.

15. The display device of claim 14, wherein an overlapping area between the gate electrode and the drain electrode is equal to or less than an overlapping area between the gate electrode and the source electrode.

16. The display device of claim 15, wherein the drain electrode has a bar shape and the source electrode comprises a substantially "U" shaped portion that encloses the drain electrode.

17. The display device of claim 15, wherein the drain electrode includes a facing portion and a connecting portion both having a bar shape.

18. The display device of claim 17, wherein the source electrode comprises a substantially "U" shaped portion that encloses the facing portion.

19. The display device of claim 17, wherein the source electrode includes a first portion perpendicular to the second gate line and a second portion parallel to the second gate line, and wherein the source electrode encloses a portion of the facing portion.

20. The display device of claim 17, wherein the facing portion is perpendicular to the second gate line and the source electrode is parallel to the facing portion.

21. The display device of claim 1, wherein the assistance capacitor is connected between the first thin film transistor and the third thin film transistor.

* * * * *